(12) United States Patent
Kuebelbeck et al.

(10) Patent No.: US 8,461,057 B2
(45) Date of Patent: Jun. 11, 2013

(54) PROCESS FOR THE ROUGH-ETCHING OF SILICON SOLAR CELLS

(75) Inventors: Arnim Kuebelbeck, Bensheim (DE); Claudia Zielinski, Darmstadt (DE); Thomas Goelzenleuchter, Buettelborn (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 12/906,769

(22) Filed: Oct. 18, 2010

(65) Prior Publication Data

US 2011/0059570 A1    Mar. 10, 2011

Related U.S. Application Data

(62) Division of application No. 10/168,797, filed as application No. PCT/EP00/12328 on Dec. 7, 2000, now abandoned.

(30) Foreign Application Priority Data

Dec. 22, 1999  (DE) .................................. 199 62 136

(51) Int. Cl.
    *H01L 21/302* (2006.01)
(52) U.S. Cl.
    USPC ............. 438/753; 438/745; 438/756; 216/99; 216/103
(58) Field of Classification Search
    USPC .................... 438/745, 750, 753, 756; 216/83, 216/99, 103, 104, 106; 134/1.1, 1.2
    See application file for complete search history.

(56) References Cited

U.S. PATENT DOCUMENTS

| 3,104,167 | A |   | 9/1963  | Cotteta |
|-----------|---|---|---------|---------|
| 3,953,263 | A |   | 4/1976  | Ishikawa et al. |
| 4,137,123 | A |   | 1/1979  | Bailey et al. |
| 4,220,706 | A | * | 9/1980  | Spak .............................. 430/318 |
| 4,476,621 | A |   | 10/1984 | Bopp et al. |
| 4,971,654 | A | * | 11/1990 | Schnegg et al. ............... 438/752 |
| 5,587,046 | A |   | 12/1996 | Stadler et al. |
| 5,686,314 | A |   | 11/1997 | Miyazaki |
| 5,949,123 | A |   | 9/1999  | Levy-Clement et al. |
| 6,087,018 | A |   | 7/2000  | Uchiyama |

(Continued)

FOREIGN PATENT DOCUMENTS

| DE | 3728693 | 3/1989 |
| DE | 4414925 | 11/1995 |

(Continued)

OTHER PUBLICATIONS

Koji, Ethant, English Abstract of JP 07-183287, Jul. 21, 1995—one page.

(Continued)

*Primary Examiner* — Lan Vinh
(74) *Attorney, Agent, or Firm* — Millen, White, Zelano, Branigan, P.C.

(57) ABSTRACT

The present invention relates to a novel process for producing textured surfaces on multicrystalline, tricrystalline and monocrystalline silicon surfaces of solar cells or on silicon substrates which are used for photovoltaic purposes. It relates in particular to an etching process and an etching agent for producing a textured surface on a silicon substrate.

9 Claims, 2 Drawing Sheets

U.S. PATENT DOCUMENTS

| | | | |
|---|---|---|---|
| 6,090,361 A * | 7/2000 | Baba et al. ............... 423/350 |
| 6,149,828 A * | 11/2000 | Vaartstra ............... 216/57 |
| 6,156,968 A | 12/2000 | Nishimoto |
| 6,169,038 B1 | 1/2001 | Kruwinus et al. |
| 6,239,039 B1 * | 5/2001 | Nihonmatsu et al. ......... 438/749 |
| 6,261,845 B1 | 7/2001 | Verhaverbeke et al. |
| 6,261,969 B1 | 7/2001 | Matsuno et al. |
| 6,340,640 B1 | 1/2002 | Nishimoto |
| 6,391,145 B1 * | 5/2002 | Nishimoto et al. ...... 156/345.12 |
| 2003/0087528 A1 | 5/2003 | Kruwinus et al. |

FOREIGN PATENT DOCUMENTS

| | | |
|---|---|---|
| DE | 19654791 | 9/1997 |
| DE | 197 46706 A | 11/1998 |
| DE | 19746706 | 11/1998 |
| DE | 19806406 | 7/1999 |
| EP | 0690495 | 1/1996 |
| EP | 0791953 | 9/1997 |
| EP | 0905754 | 3/1999 |
| JP | 07-183287 | 7/1995 |

OTHER PUBLICATIONS

Koji, Ethant, Computer generated English-translation of JP 07-183287, Jul. 21, 1995—3 pages.

Einhaus, R., et al., "Recent Progress with Acidic Texturing Solutions on Different Multicrystalline Silicon Materials Including Ribbons," $2^{nd}$ World Conference on Photovoltaic Solar Energy Conversion, Bd. II, Jul. 6-10, 1998, pp. 1630-1633, XP002166724, Vienna AT.

Einhaus, R., et al., "Isotropic Texturing of Multicrystalline Silicon Wafers with Acidic Texturing Solutions," $26^{th}$ IEEE Photovoltaic Specialists Conference, Sep. 29, 1997-Oct. 3, 1997, pp. 167-170, XP002166725, Anaheim, CA.

Verlinden, P. et al., "The Surface Texturization of Solar Cells: A New Method Using V-Grooves with Controllable Sidewall Angles," Solar Energy Materials and Solar Cells, NL, Elsevier Science Publishers, Amsterdam, Bd. 26, Nr. 1/02, Mar. 1, 1992, pp. 71-78, XP000264537.

English translation of Austrian publication corresponding to Patent No. 377 868, published May 10, 1985.

* cited by examiner t=0s t=1s

US 8,461,057 B2

PROCESS FOR THE ROUGH-ETCHING OF SILICON SOLAR CELLS

This application is a Divisional of U.S. Ser. No. 10/168,797, filed 11 May 2002 now abandoned, which was filed as a §371 National Stage of PCT/EP00/12328, filed 7 Dec. 2000.

The present invention relates to a novel process for producing textured surfaces on multicrystalline, tricrystalline and monocrystalline silicon surfaces of solar cells or on silicon substrates which are used for photovoltaic purposes. It relates in particular to an etching process and an etching agent for producing a textured surface on a silicon substrate.

Monocrystalline or multicrystalline solar cells are typically cut from solid pulled silicon rods or from cast silicon blocks by wire sawing (Dietl J., Helmreich D., Sirtl E., Crystals: Growth, Properties and Applications, Vol. 5 Springer Verlag 1981, pp. 57 and 73). One exception to this is the silicon which is pulled using the EFG (Edge defined Film Growth) process described further below (Wald, F. V.; Crystals: Growth, Properties and Applications, Vol. 5 Springer Verlag 1981, p. 157).

In this context, a relatively new development is what is known as "tricrystalline silicon" (U.S. Pat. No. 5,702,538), which in the text which follows is dealt with in the same way as a multicrystalline silicon.

The monocrystalline or multicrystalline silicon which has been sawn in this way has a rough surface, also known as saw damage, with surface roughnesses of approximately 20-30 µm. For the solar cell to be processed further, but in particular to achieve the maximum possible efficiency, a so-called damage etch is required. The contaminants situated in the trenches on the surface are removed during this damage etch. These contaminants are in particular abraded metal from the saw wire, but also traces of grinding abrasive. This etching is typically carried out in approximately 30% caustic pot ash or soda lye at temperatures of approximately 70° C. and higher. On account of the relatively low etching rate, even under these conditions, of approximately 2 µm/min, etching times of >10 min are required in order to achieve the desired effect. This etching produces a rough surface on the substrate. The cone angles produced on the surface are very flat and are altogether unsuitable for reducing reflection or even for multiple reflection on the surface. Such reflection effects are, however, desirable in order to achieve high cell efficiencies. Therefore, a large number of publications and patents deal with the matter of reducing reflection on solar cells of whatever type, for example including for amorphous solar cells (U.S. Pat. No. 4,252,865 A).

In the case of monocrystalline silicon, the reduction in reflection can be achieved by the silicon wafers, after the damage etch, being etched using approx. 5-10% caustic pot ash or soda lye (texture etch). As a result of the anisotropic etching (Heuberger A., "Mikromechanik" [Micromechanics], Springer Verlag 1989; Price J. B., "Semiconductor Silicon", Princeton N.J. 1983, p. 339) random pyramids with a <111> crystal orientation (Goetzberger A., Voβ B., Knobloch J.; Sonnenenergie: Photovoltaik [photovoltaics], Teubner Studienbücher 1997, p. 178 f.) and edge lengths of approximately 1-10 are etched out of the <100> oriented base material. A US patent (U.S. Pat. No. 4,137,1238 A) also deals extensively with this process.

However, this process fails when using multicrystalline silicon, since the base material does not have a controlled crystal orientation, but rather a multiplicity of orientation planes.

The multicrystalline silicon which is pulled using the EFG process does not have any saw damage in the plane, since the production process does not involve a sawing process. However, in this case too, as in the cast and sawn multicrystalline cells, texturing would be advantageous in order to improve efficiency. However, in this case too, the production of random pyramids fails on account of the multicrystalline nature of the material.

In addition to the anisotropic etching with strong lyes described in the introduction, six competing processes are known per se which enable an optically advantageous surface structure to be produced on the silicon surface in particular for multicrystalline solar cells.

These processes are:

1. Sandblasting

In this case, the surface is roughened by mechanical blasting with extremely fine sand or corundum or silicon carbide particles [JP 59-82778 (1984)]. The process is mechanically very complex and both the process control and the contamination of the surface with cationic contaminants are deemed to be extremely unfavourable.

2. Milling

In this case, V-shaped trenches are milled into the surface of the substrate [DE19930043]. Drawbacks include the high mechanical outlay and the contamination with abraded metal. Subsequent cleaning and etching are necessary and expensive. In addition, the relatively thin design of the silicon which is generally desired in order to reduce costs cannot be employed.

3. Anodic Oxidation

In anodic oxidation, the silicon substrate which is to be textured is anodically etched using platinum electrodes in a mixture, for example, of one part by volume 50% hydrofluoric acid and one part by volume ethanol. In this way, a nanoporous silicon with a highly active surface is produced. The process is known in the field of micromechanics and is characterized by a very low throughput (time-consuming single-substrate process) and a high outlay on equipment.

4. Sputter Etching

This process, which is described in [JP 58 15938 (1983)] is also distinguished by a high outlay on equipment.

5. Laser-Assisted Process

In this process, either etching is laser-assisted and anisotropic using NaOH or KOH (U.S. Pat. No. 5,081,049) or trench-like structures are directly applied to the substrate by laser (U.S. Pat. No. 4,626,613). In this case too, the outlay on equipment is extremely high and, furthermore, the throughput of an installation of this type is considerably limited.

6. Photolithographic Texturing

After coating with a photoresist, a structure comprising, for example, circles or lines is exposed and developed on the substrate. Then, by way of example, a mixture of nitric acid, acetic acid and hydrofluoric acid is used to carry out isotropic etching into the silicon. In the process, conical holes are formed from the circles or V-shaped trenches are formed from the lines. The highly complex and expensive process is described, for example, in (U.S. Pat. No. 5,702,538).

Therefore, an object of the present invention is to provide an inexpensive process which is easy to carry out for producing textured surfaces on multicrystalline, tricrystalline and monocrystalline silicon surfaces of solar cells or of silicon substrates which are used for photovoltaic purposes, which process does not have the drawbacks described above. Another object of the present invention is to provide an agent for carrying out the process.

The object according to the invention is achieved by a novel etching mixture and a process in which this mixture is used.

The present invention relates to an etching mixture for producing a textured surface on multicrystalline, tricrystalline and monocrystalline silicon surfaces of solar cells or on silicon substrates, for photovoltaic purposes, comprising hydrofluoric acid and mineral acids selected from the group consisting of nitric acid, sulphuric acid and phosphoric acid.

The present invention relates in particular to an etching mixture comprising hydrofluoric acid, nitric acid and sulphuric acid and/or phosphoric acid.

Etching mixtures which comprise an additional oxidizing agent which suppresses the formation of nitrogen oxides and, if appropriate, a surface-active substance selected from the group consisting of the polyfluorinated amines and the sulphonic acids have proven particularly effective.

The scope of the present invention also encompasses corresponding etching mixtures which comprise an additional oxidizing agent selected from the group consisting of hydrogen peroxide, ammonium peroxydisulphate and perchloric acid.

According to the invention, the present object is achieved by etching mixtures comprising 1-30% HF, 5-30% nitric acid, 50 to 94% concentrated sulphuric acid or concentrated phosphoric acid or 50 to 94% of a mixture of concentrated sulphuric acid and concentrated phosphoric acid.

In particular, the object according to the invention is also achieved by a process for producing textured surfaces on multicrystalline, tricrystalline and monocrystalline silicon surfaces of solar cells or on silicon substrates for photovoltaic purposes, in which a) an etching mixture as characterized above is brought into contact with the entire surface at a suitable temperature by spraying, dipping, capillary coating or meniscus coating, resulting in incipient isotropic etching, and b) the etching mixture is rinsed off after a sufficient duration of action.

In a particular embodiment of the process according to the invention, a damage etch is carried out in addition to the texture etch. This is achieved by using an etching mixture which comprises 10-16% HF, 20-30% $HNO_3$, 15-25% $H_2SO_4$, 14-20% $H_3PO_4$ and 20-30% water.

Good results are achieved if the etching operation is carried out at a temperature of between 15 and 30° C., in particular at room temperature, and a duration of action of between 2 and 30 minutes is selected.

A further process variant consists in an etching mixture which comprises 3-7% HF, 3-7% $HNO_3$, 75-85% $H_2SO_4$ and 5-15% water and which is rinsed off after a duration of action of 1-5 minutes being used for the rough-etching.

As described, inter alia during the texturing of multicrystalline silicon, there were problems with the alkaline damage etch and the production of a reflection-reducing surface.

A known process for producing rough surfaces on silicon substrates in microelectronics is the so-called spin etch process, which is described in U.S. Pat. No. 4,903,717. In a partial step of this process, the silicon surface is roughened in order to achieve improved adhesion of the thin-etched microchips during bonding onto the carrier. In this process, commercially available etching mixtures, e.g. Spinetch® E, are used.

Figure 1:
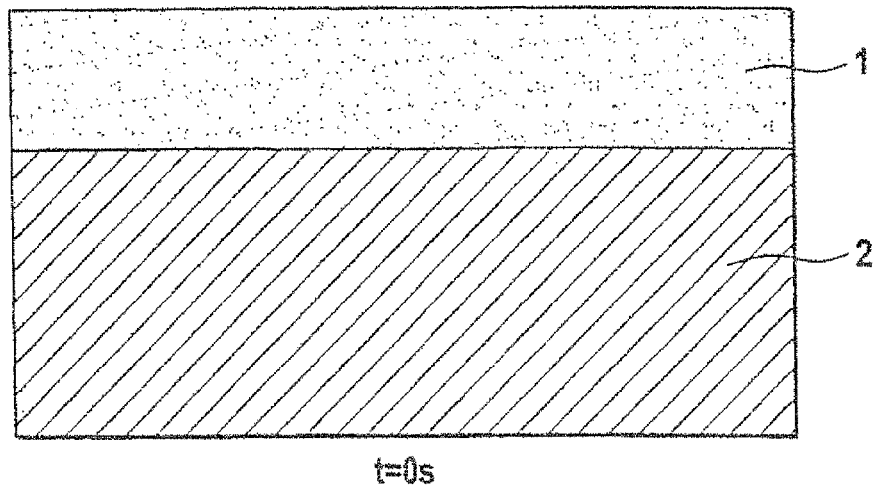
FIG. 1 depicts the application of an etching mixture (1) to a silicon substrate (2).
Figure 2:
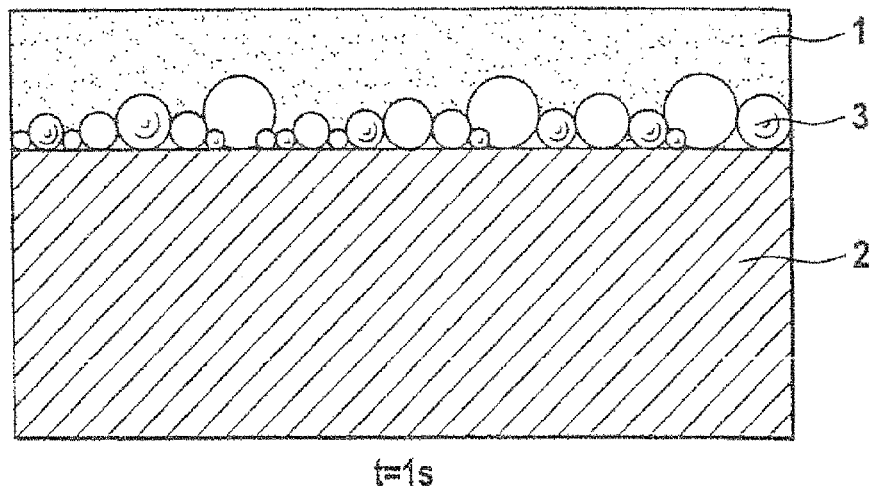
FIG. 2 depicts small bubbles (3) of nitrous gases that are formed on the surface of the silicon substrate (2).
Figure 3:
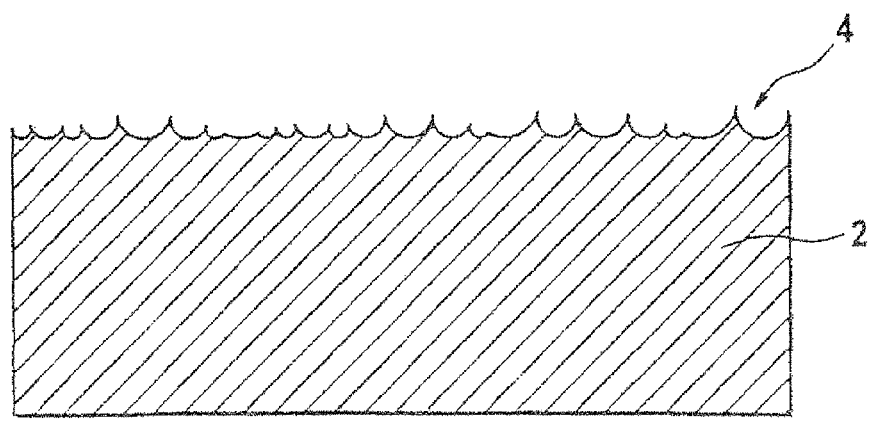
FIG. 3 depicts the roughening of the surface of the silicon (4)

Investigations of the rough-etching effect and changing the etching mixtures have led to the discovery that a gas bubble effect is substantially responsible for the rough-etching. Following the application of a suitable etching mixture (1) to a silicon substrate (2) (FIG. 1) or immersion of the silicon in the etching mixture, extremely small bubbles (3) of nitrous gases are formed on the surface of the silicon substrate (2) in less than one second after the application (FIG. 2). Tests have shown that if the etching mixture contains added hydrogen peroxide or ammonium peroxydisulphate, bubbles of oxygen are formed instead of the nitrous gases. The gas bubbles (3) locally prevent the further etching of the silicon, since as a result of their growing onto and remaining on the surface of the silicon, they make it difficult for further etching mixture to be supplied to the silicon (2). This leads to inhomogeneities in the etching rate distributed over the substrate. This effect ultimately leads (FIG. 3) to roughening of the surface of the silicon (4).

The roughness of the surface can be influenced within broad limits by varying the external parameters (e.g. temperature, time, feed of media over the substrate) and primarily also by means of the composition of the etching mixture. The shape and radii of the gas bubbles, but in particular their area of contact with the silicon, are decisive factors in achieving the desired roughening effect.

The tests have shown that the smaller the gas bubbles which adhere to the surface during the etching operation, the rougher the surface which can be achieved. Therefore, the object of the novel development had to be as far as possible to suppress the formation of relatively large bubbles, which are therefore generally no longer spherical and thus form a relatively large area of contact with the silicon, thus impeding the etching over relatively large areas.

It has been found that this object can be achieved by controlled variation and selection of the etching mixture components and the further etching parameters. It has proven particularly advantageous to use a high-viscosity mineral acid, such as for example phosphoric acid or sulphuric acid, as the basis of the etching mixture, since the viscosity significantly promotes the formation and stabilization of in particular extremely small spherical gas bubbles. Further tests have found that the number and properties of the gas bubbles can be advantageously influenced by the addition of surface-active substances which are stable in these etching mixtures, such as for example polyfluorinated amines or sulphonic acids.

The etching mixture may be applied to the silicon substrate by various methods to which the person skilled in the art is accustomed. One very simple method is the dipping, preferably of a plurality of substrates simultaneously, into the etching mixture. Spraying processes in continuous installations are also suitable. The single-side coating of the substrate on only the front surface, in which the exact amount of material required for the etching is applied, is particularly favourable in terms of consumption of the material. Advantageous processes in this connection are described, for example in U.S. Pat. No. 5,455,062 and DE 19600985. In these processes, the etching mixture is utilized until it is "exhausted" and is then rinsed off. This additionally ensures a high level of process uniformity, since fresh, unused etching solution is always fed to the substrate.

Irrespective of the processing method, the composition of the etching mixture may be selected in such a way that, in addition to the desired roughening effect, a damage etch also takes place in parallel. This is highly advantageous in particular for multicrystalline, cast silicon. This process is not necessary for EFG silicon.

A positive side effect of the acidic rough-etching according to the invention is that, provided that correspondingly pure starting materials have been used, there is no cationic contamination of the substrate.

Any contamination caused by metals (Fe, Ti, Ni, etc) which may be present on the substrate surface is advantageously converted into soluble compounds and removed when the acidic texture etching solution is rinsed off. Additional cleaning and rinsing steps as are required with the alkaline etching can therefore be dispensed with.

The high etching rate which can be achieved with the process according to the invention and is influenced in particular by the selection of the etching mixture used is particularly advantageous. It makes its presence felt in particular in considerably shorter process times compared to the alkaline etching.

Hydrofluoric acid has proven to be an essential, indispensable constituent of the active etching mixtures, even if it does not necessarily have to be used in high concentrations. Even 1% hydrofluoric acid in the etching mixture may be sufficient. The concentrations typically lie in the range from 1-30% HF, particularly advantageously in the range from 3 to 15% HF. Nitric acid, hydrogen peroxide, perchloric acid or similar oxidizing agents or mixtures of these compounds may be contained in the etching mixture as oxidative component. With regard to the stability of the solution, it has proven particularly advantageous if the etching mixture comprises nitric acid in a concentration range of 5-30%.

As has already been mentioned above, a base material with a relatively high viscosity is particularly advantageous for the formation and fixing of gas bubbles. The proportion of this base component, which has no direct effect on the actual chemical etching mechanism, is typically 50-94%, based on the total mixture. In this context, it is extremely advantageous to use concentrated sulphuric acid which, in addition to the required viscosity, increases the etching rate and binds the water formed in the etching process, advantageously into the mixture.

Figure 4:
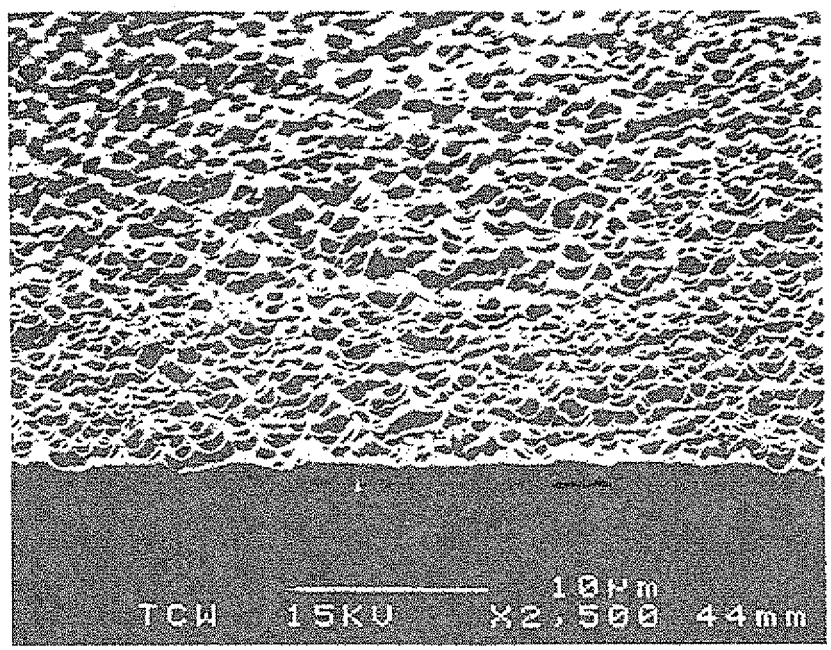
FIG. 4 depicts a silicon substrate that has been dipped into the etching mixture for approx. 2 min at room temperature.
Figure 5:
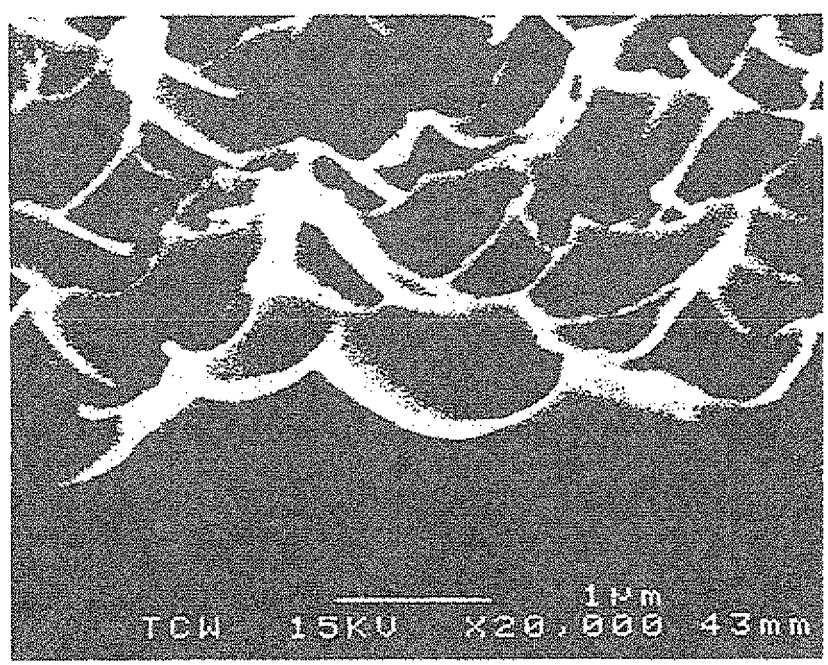
FIG. 5 depicts the steep flanks of the etching craters.

Tests have shown that for the rough-etching it is possible to use etching mixtures which contain 3-7% HF, 3-7% $HNO_3$, 75-85% $H_2SO_4$ and 5-15% water. Durations of action of between 1 and 5 minutes have led to good results. A typical rough etch for producing a roughness with texture depths and widths of approximately 1-3 μm has the following composition: 5% HF, 5% $HNO_3$, 80% $H_2SO_4$, 10% $H_2O$. With a duration of action of approx. 2 min and processing at room temperature, after the silicon substrate has been dipped into the etching mixture described the surface structure shown in FIG. 4 is obtained. The steep flanks of the etching craters produced by the etching can be seen clearly in FIG. 5. These steep flanks are highly advantageous with a view to increasing the efficiency of a solar cell. The integral etching rate during this etching as laid down in DIN 50453 part 1 is approx. 2 μm/min at 20° C.

Furthermore, it has been found that in addition to the texture etch it is also possible to achieve a damage etch on the silicon surface if an etching mixture which comprises 10-16% HF, 20-30% $HNO_3$, 15-25% $H_2SO_4$, 14-20% $H_3PO_4$ and 20-30% water is used.

A damage etch mixture with a roughening action which leads to good results has, for example, the following composition: 13% HF, 25% $HNO_3$, 20% $H_2SO_4$, 17% $H_3PO_4$, 25% $H_2O$.

After a duration of action of 30 min and an integral etching rate of approx. 130 μm/min, the textures which have been imposed by the sawing of the wafer are etched away and the desired roughening of the surface is obtained.

In general, it has been found that the process according to the invention gives good etching results if the etching operation is carried out at a temperature of between 15 and 30° C., in particular at room temperature, and if a duration of action of between 2 and 30 minutes is selected.

The nitrous gases formed during the etching are undesirable on account of their toxicity. Therefore, the use of a second oxidizing component has proven advantageous in order to suppress the formation of nitrous gases. Suitable additives are, for example, hydrogen peroxide, ammonium peroxydisulphate, inter alia, as mentioned in U.S. Pat. No. 3,953,263. The addition of such components has the advantageous effect of suppressing the formation of nitrous gases and instead, however, forming oxygen bubbles, which have the same effect during the etching operation.

The invention claimed is:

1. A process for producing a textured surface on a multicrystalline, tricrystalline or monocrystalline silicon surface of a solar cell or on a silicon substrate photovoltaic surface by etching comprising
   a) contacting an etching mixture comprising 3-15% by weight HF and a mixture of mineral acids consisting of 5-30% by weight nitric acid and sulphuric acid with the entire surface at a suitable temperature by spraying, dipping, capillary coating or meniscus coating to effect incipient isotropic etching, and
   b) rinsing off the etching mixture after a sufficient duration of action.

2. A process according to claim 1, wherein the etching mixture comprises 10-16% by weight HF, 20-30% by weight $HNO_3$, 15-25% by weight $H_2SO_4$ and 20-30% by weight water.

3. A process according to claim 1, wherein the etching operation is carried out at a temperature of between 15 and 30° C.

4. A process according to claim 1, having a duration of action of between 2 and 30 minutes.

5. A process according to claim 1, wherein the etching operation is carried out at room temperature.

6. A process according to claim 1, wherein the etching mixture is rinsed off after a duration of action of 1-5 minutes.

7. A process according to claim 1, wherein said etching mixture further comprises an additional oxidizing agent which suppresses the formation of nitrogen oxides and, optionally, a surface-active substance selected from the group consisting of polyfluorinated amines and sulphonic acid.

8. A process according to claim 1, wherein said etching mixture further comprises an additional oxidizing agent selected from the group consisting of hydrogen peroxide, ammonium peroxydisulphate and perchloric acid.

9. A process for producing a textured surface on a multicrystalline, tricrystalline or monocrystalline silicon surface of a solar cell or on a silicon substrate photovoltaic surface comprising
   a) contacting an etching mixture comprising 3-15% by weight HF, 5-30% by weight nitric acid and 15-25% by weight sulphuric acid with the entire surface at a suitable temperature by spraying, dipping, capillary coating or meniscus coating to effect incipient isotropic etching, and
   b) rinsing off the etching mixture after a sufficient duration of action.

* * * * *